United States Patent
Chen et al.

(10) Patent No.: US 10,566,563 B2
(45) Date of Patent: Feb. 18, 2020

(54) ORGANIC LIGHT EMITTING DIODE COMPONENT AND LAMP

(71) Applicants: BOE TECHNOLOGY GROUP CO., LTD., Beijing (CN); CHENGDU BOE OPTOELECTRONICS TECHNOLOGY Co., LTD., Chengdu, Sichuan (CN)

(72) Inventors: Dong Chen, Beijing (CN); Yinan Liang, Beijing (CN); Chao Kong, Beijing (CN)

(73) Assignees: BOE Technology Group Co., Ltd., Beijing (CN); Chengdu BOE Optoelectronics Co., Ltd., Chengdu, Sichuan (CN)

( * ) Notice: Subject to any disclaimer, the term of this patent is extended or adjusted under 35 U.S.C. 154(b) by 118 days.

(21) Appl. No.: 15/745,017

(22) PCT Filed: Jul. 21, 2017

(86) PCT No.: PCT/CN2017/093828
§ 371 (c)(1),
(2) Date: Jan. 15, 2018

(87) PCT Pub. No.: WO2018/099099
PCT Pub. Date: Jun. 7, 2018

(65) Prior Publication Data
US 2019/0013491 A1    Jan. 10, 2019

(30) Foreign Application Priority Data
Nov. 30, 2016  (CN) .......................... 2016 1 1080494

(51) Int. Cl.
*H01L 51/50* (2006.01)
*C09K 11/06* (2006.01)
(Continued)

(52) U.S. Cl.
CPC .......... *H01L 51/5056* (2013.01); *C09K 11/06* (2013.01); *H01L 51/5072* (2013.01);
(Continued)

(58) Field of Classification Search
CPC ............. H01L 51/5056; H01L 51/5072; H01L 51/5221
See application file for complete search history.

(56) References Cited

U.S. PATENT DOCUMENTS

| 6,413,339 B1 | 7/2002 | Natarajan et al. |
| 7,759,671 B2 | 7/2010 | Hsu et al. |
| 8,507,932 B2 * | 8/2013 | Ke .................. H01L 35/507 257/98 |

FOREIGN PATENT DOCUMENTS

| CN | 1913731 A | 2/2007 |
| CN | 101919073 A | 12/2010 |

(Continued)

OTHER PUBLICATIONS

International Search Report dated Oct. 24, 2017 issued in International Application No. PCT/CN2017/093828 along with English Translation of the ISR and Written Opinion.
(Continued)

*Primary Examiner* — Douglas M Menz
(74) *Attorney, Agent, or Firm* — Nath, Goldberg & Meyer; Joshua B. Goldberg; Daniel J. Bissig

(57) ABSTRACT

The present disclosure provides an organic light emitting diode component and a lamp containing the same, the organic light emitting diode component includes an organic light emitting diode, the organic light emitting diode includes an electron transport layer, an organic light emitting material layer and a hole transport layer, and the organic light emitting diode component further includes a magnetic field supply element, the magnetic field supply element supplies a magnetic field, in a case where the magnetic field
(Continued)

supply element supplies the magnetic field, at least a part of the organic light emitting diode is located in the magnetic field, the electron transport layer of the organic light emitting diode includes a material with an electron mobility varying with changing of the magnetic field, and/or the hole transport layer of the organic light emitting diode includes a material with a hole mobility varying with changing of the magnetic field.

12 Claims, 3 Drawing Sheets

(51) Int. Cl.
    *H01L 51/52*     (2006.01)
    *H01L 51/00*     (2006.01)

(52) U.S. Cl.
    CPC ........ *H01L 51/5221* (2013.01); *H01L 51/008* (2013.01); *H01L 51/5004* (2013.01); *H01L 2251/5361* (2013.01)

(56) References Cited

FOREIGN PATENT DOCUMENTS

| | | |
|---|---|---|
| CN | 102290530 A | 12/2011 |
| CN | 103887439 A | 6/2014 |
| CN | 105932178 A | 9/2016 |
| CN | 106057860 A | 10/2016 |
| CN | 106384787 A | 2/2017 |
| JP | 2013219278 A | 10/2013 |

OTHER PUBLICATIONS

First Office Action dated Aug. 24, 2017 issued in corresponding Chinese Application No. 201611080494.4.
Second Office Action dated Dec. 28, 2017 issued in corresponding Chinese Application No. 201611080494.4.

* cited by examiner

ORGANIC LIGHT EMITTING DIODE COMPONENT AND LAMP

CROSS REFERENCE FOR RELATED APPLICATION

This is a National Phase Application filed under 35 U.S.C. 371 as a national stage of PCT/CN2017/093828, filed on Jul. 21, 2017, an application claiming the priority of Chinese patent application No. 201611080494.4 filed on Nov. 30, 2016, the full content of which is incorporated here by reference.

FIELD

The present disclosure relates to the field of lighting device, and particularly to an organic light emitting diode component and a lamp containing the same.

BACKGROUND

Due to advantages such as high brightness and low power consumption, organic light emitting diodes have been applied widely in lighting.

An organic light emitting diode includes an anode, a hole transport layer, a luminescent material layer, an electron transport layer and a cathode which are provided in a stack. The organic light emitting diode may emit light of different colors by changing material of the luminescent material layer thereof.

However, at present, the organic light emitting diodes have a single structure and cannot meet needs of market diversification.

SUMMARY

In order to achieve the object said above, in an aspect of the present disclosure, there is provided an organic light emitting diode component including an organic light emitting diode, the organic light emitting diode includes an electron transport layer, an organic light emitting material layer and a hole transport layer, and the organic light emitting diode component further includes a magnetic field supply element, the magnetic field supply element supplies a magnetic field, and in a case where the magnetic field supply element supplies the magnetic field, at least a part of the organic light emitting diode is located in the magnetic field, the electron transport layer of the organic light emitting diode includes a material with an electron mobility varying with changing of the magnetic field, and/or the hole transport layer of the organic light emitting diode includes a material with a hole mobility varying with changing of the magnetic field.

In some implementations, the magnetic field supply element provides a magnetic field with an adjustable intensity.

In some implementations, the intensity of the magnetic field provided by the magnetic field supply element may be adjusted in a range from 0 mT to 500 mT.

In some implementations, the electron transport layer and the hole transport layer of the organic light emitting diode meet at least one of following relationships: the electron mobility of the material of the electron transport layer does not vary with changing of the intensity of the magnetic field, and the hole mobility of the material of the hole transport layer is positively associated with the intensity of the magnetic field; the electron mobility of the material of the electron transport layer does not vary with changing of the intensity of the magnetic field, and the hole mobility of the material of the hole transport layer is inversely associated with the intensity of the magnetic field; the hole mobility of the material of the hole transport layer does not vary with changing of the intensity of the magnetic field, and the electron mobility of the material of the electron transport layer is positively associated with the intensity of the magnetic field; the hole mobility of the material of the hole transport layer does not vary with changing of the intensity of the magnetic field, and the electron mobility of the material of the electron transport layer is inversely associated with the intensity of the magnetic field; the electron mobility of the material of the electron transport layer is positively associated with the intensity of the magnetic field, and the hole mobility of the material of the hole transport layer is inversely associated with the intensity of the magnetic field; the electron mobility of the material of the electron transport layer is inversely associated with the intensity of the magnetic field, and the hole mobility of the material of the hole transport layer is positively associated with the intensity of the magnetic field.

In some implementations, the organic light emitting diode component further includes a substrate, and the organic light emitting diode and the magnetic field supply element are provided on the substrate.

In some implementations, the magnetic field supply element includes a radio-frequency (RF) magnetic field supply device.

In some implementations, the magnetic field supply element is provided at a side of the organic light emitting diode.

Alternatively, the RF magnetic field supply device may include a first RF magnetic field supply device and a second RF magnetic field supply device, and the first RF magnetic field supply device and the second RF magnetic field supply device are provided at two sides of the organic light emitting diode respectively.

In some implementations, the magnetic field supply element includes a first electromagnetism supply electrode and a second electromagnetism supply electrode, and the organic light emitting diode is provided between the first electromagnetism supply electrode and the second electromagnetism supply electrode.

In some implementations, the organic light emitting diode component further includes a substrate, the substrate includes a first mounting surface, a second mounting surface opposite to the first mounting surface, a first side surface connecting the first mounting surface and the second mounting surface, and a second side surface opposite to the first side surface, the first electromagnetism supply electrode is provided on the first mounting surface, the organic light emitting diode is provided on the second mounting surface, and the second electromagnetism supply electrode is provided on the organic light emitting diode, so that the first electromagnetism supply electrode, the substrate, the organic light emitting diode and the second electromagnetism supply electrode are provided successively in a stack.

Alternatively, the organic light emitting diode may be provided on the second mounting surface, the first electromagnetism supply electrode is connected to the first side surface, and the second electromagnetism supply electrode is connected to the second side surface.

In some implementations, the organic light emitting material layer has a LUMO energy level higher than that of the electron transport layer by 0.3 eV to 0.8 eV, and a HOMO energy level higher than that of the electron transport layer by 0.3 eV to 0.8 eV.

In another aspect of the present disclosure, there is provided a lamp including the organic light emitting diode component provided by the present disclosure.

In some implementations, the lamp further includes a magnetic field adjusting component for adjusting the intensity of the magnetic field provided by the magnetic field supply element.

BRIEF DESCRIPTION OF THE DRAWINGS

Drawings are provided for further understanding of the present disclosure, constitute a part of specification of the present disclosure, and are used for explaining the present disclosure in conjunction with following embodiments, but the present disclosure is not limited thereto. In the drawings.

DETAILED DESCRIPTION OF THE EMBODIMENTS

Embodiments of the present disclosure will be described in detail below in conjunction with accompanying drawings. It should be understood that, the embodiments described herein are only examples for illustrating and explaining the present disclosure and the present disclosure is not limited thereto.

In an aspect of the present disclosure, there is provided an organic light emitting diode component including an organic light emitting diode 100, the organic light emitting diode 100 has a laminated structure, and specifically includes a hole transport layer, an organic light emitting material layer and an electron transport layer, and the organic light emitting diode component further includes a magnetic field supply element 300, the magnetic field supply element 300 supplies a magnetic field, and in a case where the magnetic field supply element 300 supplies the magnetic field, at least a part of the organic light emitting diode 100 is located in the magnetic field, the electron transport layer of the organic light emitting diode 100 includes a material with an electron mobility varying with changing of the magnetic field, and/or the hole transport layer of the organic light emitting diode 100 includes a material with a hole mobility varying with changing of the magnetic field.

It should be understood by persons skilled in the art that, the organic light emitting diode 100 further includes an anode and a cathode.

In a case where the organic light emitting diode 100 emits light, there is no absolute balance between electrons and holes in the organic light emitting diode 100, thus the electrons and the holes accumulate at interfaces of two sides of the organic light emitting material layer in the organic light emitting diode 100, which results in that an energy of an exciton is increased to transition to a higher energy level. For a same organic light emitting diode, different accumulation modes of carriers result in varying of spectrum of light emitted by the organic light emitting diode.

Figure 6A:
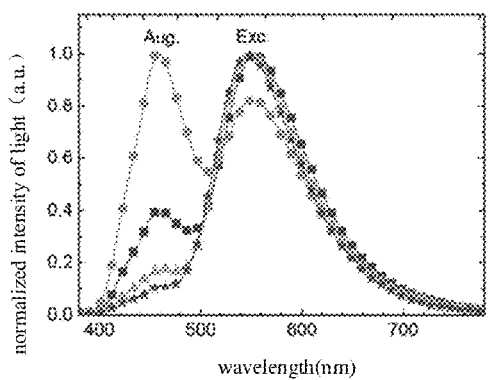
FIG. 6a shows that a magnetic field causes electrons to accumulate so that a wavelength of light emitted shifts towards a short wave direction.
Figure 6B:
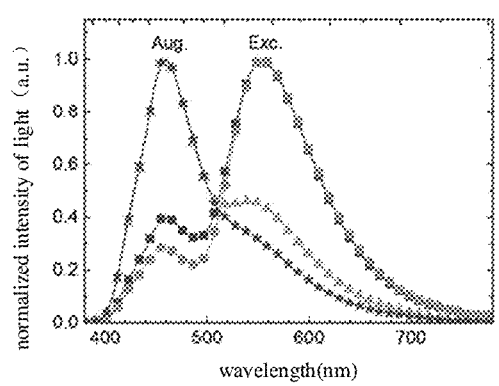
FIG. 6b shows that a magnetic field causes holes to accumulate so that a wavelength of light emitted shifts towards a long wave direction.

FIGS. 6a and 6b show a relationship diagram between a wavelength and an intensity of light emitted. Specifically, FIG. 6a shows that a magnetic field causes electrons to accumulate so that a wavelength of light emitted shifts towards a short wave direction, and FIG. 6b shows that a magnetic field causes holes to accumulate so that a wavelength of light emitted shifts towards a long wave direction.

More specifically, curves of FIG. 6a show that the wavelength of light emitted by the organic light emitting diode 100 shifts towards the short wave direction in a case where the intensity of the magnetic field provided by the magnetic field supply element 300 is increased, the intensity of light with a short wavelength (Aug.) increases with increasing of the intensity of the magnetic field. Similarly, curves of FIG. 6b show that the wavelength of light emitted by another organic light emitting diode 100 shifts towards a long wave direction in a case where the intensity of the magnetic field provided by the magnetic field supply element 300 is increased, the intensity of light with a long wavelength (Exe.) increases with increasing of the intensity of the magnetic field.

Figures 6C, 6D, 6E:
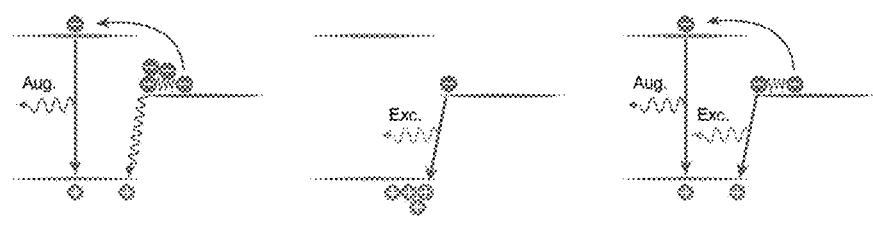
FIG. 6c shows a diagram that electrons accumulate at an interface to emit blue light.
FIG. 6d shows a diagram that holes accumulate at an interface to emit red light.
FIG. 6e shows a diagram that electrons and holes accumulate at an interface in a certain ratio to emit white light.

In a case where an accumulation of electrons is dominant at an interface of the organic light emitting material layer, an electron may have a higher energy to transition to a higher LUMO energy level, thus a wide band-gap emission includes a light spectrum of short wavelength. As shown in FIG. 6c, electrons accumulate at the interface, a blue light emission (Aug.) is generated.

In a case where an accumulation of holes is dominant at an interface of the organic light emitting material layer, since the structure of the designed device has a relatively large energy level difference, the hole cannot transition to a lower HOMO energy level, a long wave emission is achieved by the organic light emitting diode. As shown in FIG. 6d, holes accumulate at the interface, a red light emission (Exc.) is generated.

In a case where transporting capabilities of the electrons and the holes are regulated reasonably, the long wave emission (red) and the short wave emission (blue) may be achieved simultaneously to obtain white light. As shown in FIG. 6e, the electrons and the holes at the interfaces are in a certain ratio, the blue light and the red light are mixed to form the white light.

With the organic light emitting diode component of the present disclosure, by setting the intensity of the magnetic field provided by the magnetic field supply element, a color of light emitted by the organic light emitting diode 100 can be determined, thus a new organic light emitting diode component is achieved, which enriches the market and provides more choices for users.

In the present disclosure, the magnetic field supply element 300 may provide the magnetic field with a stable intensity, so that the organic light emitting diode 100 emits light with a certain color.

In some implementations, the magnetic field supply element 300 may provide the magnetic field with an adjustable intensity, and in this case, the intensity of the magnetic field may be changed in accordance with practical conditions so that the color of light emitted by the organic light emitting diode 100 may be changed to meet needs of different applications.

In a case where the magnetic field supply element 300 provides the magnetic field with an adjustable intensity, the color of light emitted by the organic light emitting diode 100 may be changed by changing the intensity of the magnetic field provided by the magnetic field supply element 300.

There is no special limitation to the intensity of the magnetic field provided by the magnetic field supply element 300 in the present disclosure. In a case where the organic light emitting diode 100 emits light, the LUMO energy level of the organic light emitting material layer is higher than that of the electron transport layer by about 0.3 eV to 0.8 eV, the HOMO energy level of the organic light emitting material layer is higher than that of the electron transport layer by about 0.3 eV to 0.8 eV. Correspondingly, the intensity of the magnetic field provided by the magnetic field supply element 300 may be adjusted in a range from 0 mT to 500 mT.

There is no special limitation to the material of the organic light emitting diode 100 in the present disclosure. The organic light emitting diode 100 may satisfy any of following six cases.

In a first case, the electron mobility of the material of the electron transport layer does not vary with changing of the intensity of the magnetic field, and the hole mobility of the material of the hole transport layer is positively associated with the intensity of the magnetic field. In this case, when the intensity of the magnetic field is increased, the electron mobility is unchanged and the hole mobility becomes higher, an accumulation of holes is formed in the organic light emitting diode 100, and the wavelength of light emitted shifts towards the long wave direction. The material of the electron transport layer may be 8-hydroxyquinoline aluminum (i.e., $Alq_3$), and the material of the hole transport layer may be N,N'-two(1-naphthyl)-N, N'-diphenyl-1,1'-phenyl-benzene-4-4'-diamine(i.e., NPB).

In a second case, the electron mobility of the material of the electron transport layer does not vary with changing of the intensity of the magnetic field, and the hole mobility of the material of the hole transport layer is inversely associated with the intensity of the magnetic field. When the intensity of the magnetic field is increased, the electron mobility is unchanged and the hole mobility becomes lower, an accumulation of electrons is formed in the organic light emitting diode 100, the wavelength of light emitted shifts towards the short wave direction. The material of the electron transport layer may be 8-hydroxyquinoline aluminum, and the material of the hole transport layer may be 12-O-fourteen alkyl acetate-13 (i.e., TPA).

In a third case, the hole mobility of the material of the hole transport layer does not vary with changing of the intensity of the magnetic field, and the electron mobility of the material of the electron transport layer is positively associated with the intensity of the magnetic field. When the intensity of the magnetic field is increased, the hole mobility is unchanged and the electron mobility is increased, an accumulation of electrons is formed in the organic light emitting diode 100, the wavelength of light emitted shifts towards the short wave direction. The material of the hole transport layer may be three(2-benzyl pyridine)cobalt (i.e., $Co(ppy)_3$), and the material of the electron transport layer may be three(2,4,6-three methyl-3-(pyridine-3-base)phenyl) borane (i.e., 3TPYMB).

In a fourth case, the hole mobility of the material of the hole transport layer does not vary with changing of the intensity of the magnetic field, and the electron mobility of the material of the electron transport layer is inversely associated with the intensity of the magnetic field. When the intensity of the magnetic field is increased, the hole mobility is unchanged and the electron mobility is lowered, an accumulation of holes is formed in the organic light emitting diode 100, the wavelength of light emitted shifts towards the long wave direction. The material of the electron transport layer may be bathocuproine (i.e., BCP), and the material of the hole transport layer may be three(2-phenyl pyridine) cobalt.

In a fifth case, the electron mobility of the material of the electron transport layer is positively associated with the intensity of the magnetic field, and the hole mobility of the material of the hole transport layer is inversely associated with the intensity of the magnetic field. When the intensity of the magnetic field is increased, the hole mobility is lowered and the electron mobility is increased, an accumulation of electrons is formed in the organic light emitting diode 100, the wavelength of light emitted shifts towards the short wave direction. The material of the electron transport layer may be three(2,4,6-three methyl-3-(pyridine-3-based) phenyl)borane, and the material of the hole transport layer may be 12-O-fourteen alkyl phorbol acetate-13.

In a sixth case, the electron mobility of the material of the electron transport layer is inversely associated with the intensity of the magnetic field, and the hole mobility of the material of the hole transport layer is positively associated with the intensity of the magnetic field. When the intensity of the magnetic field is increased, the hole mobility is increased and the electron mobility is lowered, an accumulation of holes is formed in the organic light emitting diode 100, the wavelength of light emitted shifts towards the long wave direction. The material of the electron transport layer may be bathocuproine, and the material of the hole transport layer may be N,N'-two(1-naphthyl)-N,N'-diphenyl-1,1'-phenylbenzene-4-4'-bisamine.

There is no special limitation to the structure of the magnetic field supply element 300 in the present disclosure, and the magnetic field supply element 300 may be a RF magnetic field supply device or an electromagnetism supply device for providing a parallel magnetic field. The direction of the magnetic field provided by the RF magnetic field supply device changes at a certain frequency, and the direction of the parallel magnetic field provided by the electromagnetism supply device is constant.

Positions of elements in the organic light emitting diode component are not limited specifically in the present disclosure.

For facilitating installation, in some implementations, as shown in FIGS. 1 through 4, the organic light emitting diode component further includes a substrate 200, and the organic light emitting diode 100 and the magnetic field supply element 300 are provided on the substrate 200.

It should be noted that, although there is no limitation to arrangement of the magnetic field supply element 300, the magnetic field supply element 300 should not shield the light exiting surface of the organic light emitting diode 100.

Figure 1:
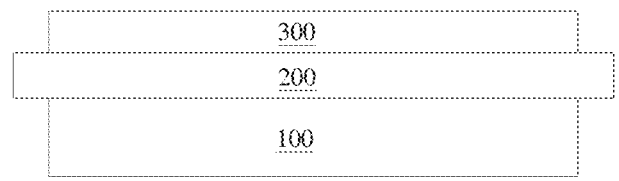
FIG. 1 shows a diagram of a first implementation of an organic light emitting diode component provided by the present disclosure.

As shown in FIG. 1, the magnetic field supply element 300 is the RF magnetic field supply device, and is provided at a side of the organic light emitting diode 100. Specifically, the magnetic field supply element 300 is fixed on a surface (e.g., the upper surface shown in FIG. 1) of the substrate 100, and the organic light emitting diode 100 is fixed on another side (e.g., the lower surface shown in FIG. 1) of the substrate 200.

Figure 2:
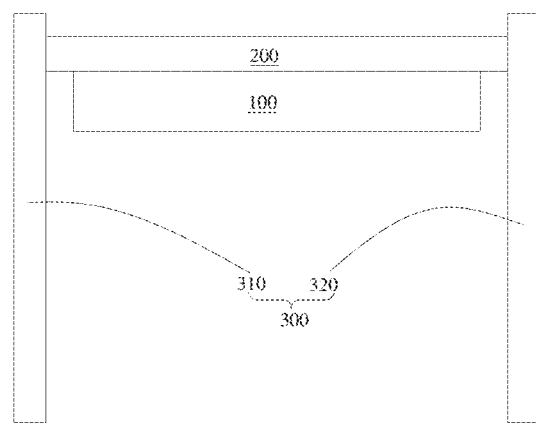
FIG. 2 shows a diagram of a second implementation of an organic light emitting diode component provided by the present disclosure.

In the implementation shown in FIG. 2, the RF magnetic field supply device includes a first RF magnetic field supply device 310 and a second RF magnetic field supply device 320, and the first RF magnetic field supply device 310 and the second RF magnetic field supply device 320 are provided at two ends of the organic light emitting diode 100 respectively. As shown in FIG. 2, the first RF magnetic field supply device 310 and the second RF magnetic field supply device 320 are provided at right and left end surfaces of the organic light emitting diode 100 respectively.

Figure 3:
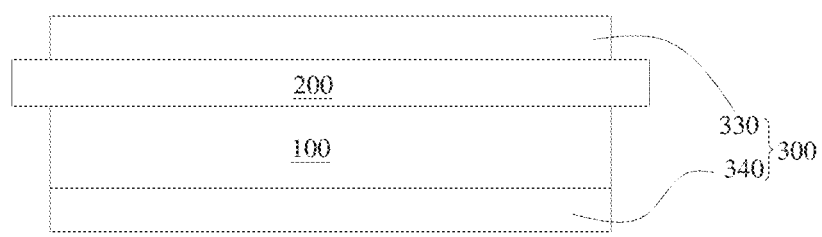
FIG. 3 shows a diagram of a third implementation of an organic light emitting diode component provided by the present disclosure.
Figure 4:
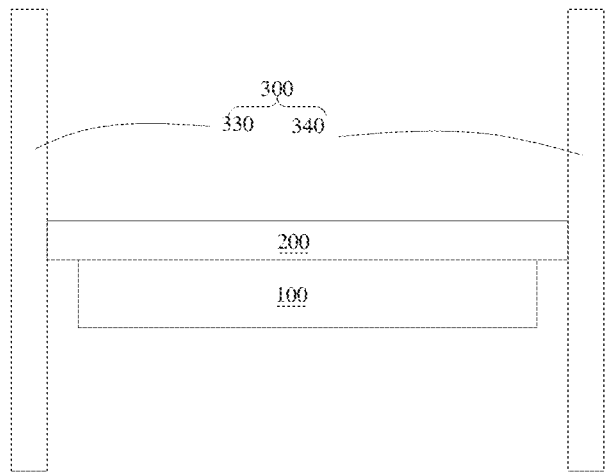
FIG. 4 shows a diagram of a fourth implementation of an organic light emitting diode component provided by the present disclosure.

FIGS. 3 and 4 show that the magnetic field supply element 300 is an electromagnetism supply device for providing the parallel magnetic field.

In such implementation, the magnetic field supply element 300 includes a first electromagnetism supply electrode 330 and a second electromagnetism supply electrode 340, and the organic light emitting diode 100 is provided between the first electromagnetism supply electrode 330 and the second electromagnetism supply electrode 340. The intensity of the magnetic field provided by the magnetic field supply element 300 may be adjusted by adjusting the voltage applied to the first electromagnetism supply electrode 330 and the second electromagnetism supply electrode 340.

In implementations shown in FIGS. 3 and 4, the first electromagnetism supply electrode 330 and the second electromagnetism supply electrode 340 are provided on the substrate 200. The substrate 200 includes a first mounting surface, a second mounting surface opposite to the first mounting surface, a first side surface connecting the first mounting surface and the second mounting surface, and a second side surface opposite to the first side surface.

In the implementation shown in FIG. 3, the first electromagnetism supply electrode 330 is provided on the first mounting surface, the organic light emitting diode 100 is provided on the second mounting surface, and the second electromagnetism supply electrode 340 is provided on the organic light emitting diode 100, so that the first electromagnetism supply electrode 330, the substrate 200, the organic light emitting diode 100 and the second electromagnetism supply electrode 340 are provided successively in a stack.

In the implementation shown in FIG. 4, the organic light emitting diode 100 is provided on the second mounting surface, the first electromagnetism supply electrode 330 is connected to the first side, and the second electromagnetism supply electrode 340 is connected to the second side.

Figure 5:
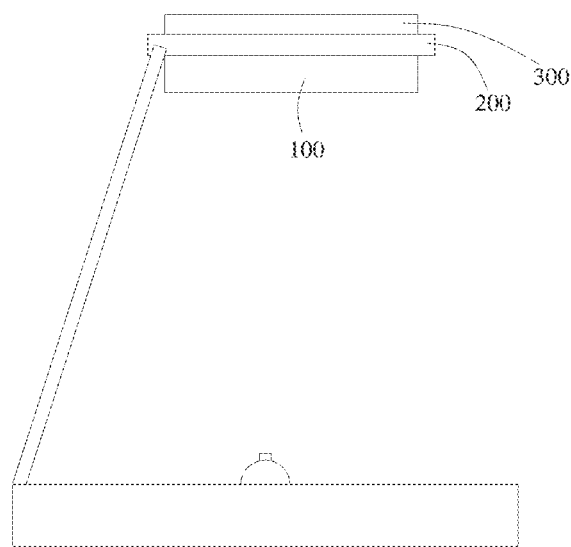
FIG. 5 shows a diagram of a lamp provided by the present disclosure.

In another aspect of the present disclosure, there is provided a lamp, as shown in FIG. 5, the lamp includes the organic light emitting diode component provided by the present disclosure.

As said above, in the organic light emitting diode component, the color of light emitted by the organic light emitting diode component may be adjusted by adjusting the intensity of the magnetic field, which enriches the market and provides more choices for users.

In some implementations, the magnetic field supply element 300 may provide the magnetic field with an adjustable intensity, the lamp further includes a magnetic field adjusting component for adjusting the intensity of the magnetic field provided by the magnetic field supply element 300. Thus, the user may change the color of light emitted by the lamp by controlling the magnetic field adjusting component in accordance with preferences.

It should be understood that, the above embodiments are merely exemplary embodiments for explaining principle of the present invention, but the present invention is not limited thereto. Various modifications and improvements may be made by those ordinary skilled in the art within the spirit and essence of the present invention, these modifications and improvements fall into the protection scope of the present invention.

The invention claimed is:

1. An organic light emitting diode component, comprising an organic light emitting diode, wherein the organic light emitting diode comprises an electron transport layer, an organic light emitting material layer and a hole transport layer, and the organic light emitting diode component further comprises a magnetic field supply element, the magnetic field supply element supplies a magnetic field, and at least a part of the organic light emitting diode is located in the magnetic field, the electron transport layer of the organic light emitting diode comprises a material with an electron mobility varying with changing of the magnetic field, and/or the hole transport layer of the organic light emitting diode includes a material with a hole mobility varying with changing of the magnetic field, wherein the organic light emitting diode component further comprising a substrate, and the organic light emitting diode and the magnetic field supply element are provided on the substrate, and wherein the organic light emitting material layer has a LUMO energy level higher than that of the electron transport layer by 0.3 eV to 0.8 eV, and a HOMO energy level higher than that of the electron transport layer by 0.3 eV to 0.8 eV.

2. The organic light emitting diode component of claim 1, wherein the magnetic field supply element provides a magnetic field with an adjustable intensity.

3. The organic light emitting diode component of claim 2, wherein the intensity of the magnetic field provided by the magnetic field supply element is adjusted in a range from 0 mT to 500 mT.

4. The organic light emitting diode component of claim 1, wherein the electron transport layer and the hole transport layer of the organic light emitting diode meet at least one of following relationships:

the electron mobility of the material of the electron transport layer does not vary with changing of the intensity of the magnetic field, and the hole mobility of the material of the hole transport layer is positively associated with the intensity of the magnetic field;

the electron mobility of the material of the electron transport layer does not vary with changing of the intensity of the magnetic field, and the hole mobility of the material of the hole transport layer is inversely associated with the intensity of the magnetic field;

the hole mobility of the material of the hole transport layer does not vary with changing of the intensity of the magnetic field, and the electron mobility of the material of the electron transport layer is positively associated with the intensity of the magnetic field;

the hole mobility of the material of the hole transport layer does not vary with changing of the intensity of the magnetic field, and the electron mobility of the material of the electron transport layer is inversely associated with the intensity of the magnetic field;

the electron mobility of the material of the electron transport layer is positively associated with the intensity of the magnetic field, and the hole mobility of the material of the hole transport layer is inversely associated with the intensity of the magnetic field;

the electron mobility of the material of the electron transport layer is inversely associated with the intensity of the magnetic field, and the hole mobility of the material of the hole transport layer is positively associated with the intensity of the magnetic field.

5. The organic light emitting diode component of claim 1, wherein the magnetic field supply element comprises a radio-frequency (RF) magnetic field supply device.

6. The organic light emitting diode component of claim 5, wherein the magnetic field supply element is provided at a side of the organic light emitting diode.

7. The organic light emitting diode component of claim 5, wherein the RF magnetic field supply device comprises a first RF magnetic field supply device and a second RF magnetic field supply device, and the first RF magnetic field supply device and the second RF magnetic field supply device are provided at two sides of the organic light emitting diode respectively.

8. The organic light emitting diode component of claim 1, wherein the magnetic field supply element comprises a first electromagnetism supply electrode and a second electromagnetism supply electrode, and the organic light emitting diode is provided between the first electromagnetism supply electrode and the second electromagnetism supply electrode.

9. The organic light emitting diode component of claim 8, further comprising a substrate, the substrate comprises a first mounting surface, a second mounting surface opposite to the first mounting surface, a first side surface connecting the first mounting surface and the second mounting surface, and a second side surface opposite to the first side surface, the first electromagnetism supply electrode is provided on the first mounting surface, the organic light emitting diode is provided on the second mounting surface, and the second electromagnetism supply electrode is provided on the organic light emitting diode, so that the first electromagnetism supply electrode, the substrate, the organic light emitting diode and the second electromagnetism supply electrode are provided successively in a stack.

10. The organic light emitting diode component of claim 8, further comprising a substrate, the substrate comprises a first mounting surface, a second mounting surface opposite to the first mounting surface, a first side surface connecting the first mounting surface and the second mounting surface, and a second side surface opposite to the first side surface, the organic light emitting diode is provided on the second mounting surface, the first electromagnetism supply electrode is connected to the first side surface, and the second electromagnetism supply electrode is connected to the second side surface.

11. A lamp, comprising the organic light emitting diode component of claim 1.

12. The lamp of claim 11, further comprising a magnetic field adjusting component for adjusting the intensity of the magnetic field provided by the magnetic field supply element.

* * * * *